United States Patent
Bae et al.

(10) Patent No.: US 10,790,176 B2
(45) Date of Patent: Sep. 29, 2020

(54) SUBSTRATE CARRIER

(71) Applicant: Samsung Electronics Co., Ltd., Suwon-si, Gyeonggi-do (KR)

(72) Inventors: Du-Sik Bae, Hwaseong-si (KR); Hang-Ryong Lim, Yeongju-si (KR); Se-Won Ko, Daejeon (KR); Yoon-Mi Lee, Seoul (KR); Jin-Ho Kim, Hwaseong-si (KR); Jung-Dae Park, Yongin-si (KR); Min-Seon Lee, Seoul (KR); Yeong-Cheol Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 53 days.

(21) Appl. No.: 16/012,045

(22) Filed: Jun. 19, 2018

(65) Prior Publication Data
US 2019/0131152 A1    May 2, 2019

(30) Foreign Application Priority Data
Oct. 30, 2017    (KR) .................. 10-2017-0142873

(51) Int. Cl.
*H01L 21/67*     (2006.01)
*H01L 21/673*    (2006.01)

(52) U.S. Cl.
CPC .. *H01L 21/67253* (2013.01); *H01L 21/67248* (2013.01); *H01L 21/67353* (2013.01); *H01L 21/67359* (2013.01); *H01L 21/67393* (2013.01)

(58) Field of Classification Search
CPC ......... H01L 21/67253; H01L 21/67393; H01L 21/67282; H01L 21/67; H01L 21/673;
(Continued)

(56) References Cited

U.S. PATENT DOCUMENTS 5,879,458 A * 3/1999 Roberson, Jr. .... H01L 21/67017
                                                          118/715
7,156,129 B2 * 1/2007 Speasl ................. G03F 7/7075
                                                           141/11
(Continued)

FOREIGN PATENT DOCUMENTS

JP    2002176097    6/2002
JP    4355488       8/2009
(Continued)

OTHER PUBLICATIONS

KR-101507436-B1_Enlgish_Translation_of_Specification (Year: 2015).*
(Continued)

*Primary Examiner* — Marina A Tietjen
*Assistant Examiner* — Stephanie A Shrieves
(74) *Attorney, Agent, or Firm* — Myers Bigel, P.A.

(57) ABSTRACT

A substrate carrier may include a carrier body and a first sensor unit. The carrier body may include an internal space, an inlet port and an outlet port. The internal space may be configured to receive a substrate. A purge gas may be introduced into the internal space through the inlet port. A gas in the internal space may be exhausted through the outlet port. The first sensor unit may be at the outlet port and configured to detect environmental properties of the internal space in real time. Thus, a generation or cause of a contaminant in the carrier body may be accurately identified.

20 Claims, 12 Drawing Sheets

(58) Field of Classification Search
CPC .. H01L 21/6735; H01L 27/67248; B65B 3/26
USPC ............... 141/63–66, 83, 98; 206/710–712; 414/935–941
See application file for complete search history.

(56) References Cited

U.S. PATENT DOCUMENTS

| | | | |
|---|---|---|---|
| 8,591,809 B2* | 11/2013 | Ra | H01L 21/67389 141/63 |
| 2002/0155647 A1* | 10/2002 | Nishiki | H01L 21/67017 438/155 |
| 2005/0138935 A1* | 6/2005 | Shin | F25B 21/02 62/3.7 |
| 2006/0266011 A1* | 11/2006 | Halbmaier | H01L 21/67389 55/385.6 |
| 2012/0083918 A1* | 4/2012 | Yamazaki | H01L 21/67389 700/112 |
| 2014/0036275 A1* | 2/2014 | Lim | G01B 11/002 356/614 |
| 2014/0041754 A1 | 2/2014 | Chou | |
| 2014/0230763 A1* | 8/2014 | Watanabe | F01L 1/344 123/90.15 |
| 2016/0343598 A1* | 11/2016 | Sakaguchi | H01L 21/67769 |
| 2017/0074727 A1* | 3/2017 | Liu | G01J 5/0007 |

FOREIGN PATENT DOCUMENTS

| | | | | |
|---|---|---|---|---|
| JP | 5473591 | | 2/2014 | |
| KR | 0885010 | | 11/2003 | |
| KR | 20070083038 | | 8/2007 | |
| KR | 20070096680 | | 10/2007 | |
| KR | 1171218 | | 7/2012 | |
| KR | 20120033991 | | 9/2012 | |
| KR | 1335669 | | 11/2013 | |
| KR | 1507436 | | 3/2015 | |
| KR | 101507436 B1 * | | 4/2015 | |
| KR | 1565091 | | 10/2015 | |
| KR | 101565091 B1 * | | 11/2015 | |
| KR | 1575652 | | 12/2015 | |
| KR | 20170076626 | | 7/2017 | |
| WO | WO-2017026168 A1 * | | 2/2017 | .............. B08B 5/02 |
| WO | WO-2017026168 A1 * | | 2/2017 | .............. B08B 5/02 |

OTHER PUBLICATIONS

WO-2017026168-A1 English Translation of Specification (Year: 2017).*
KR-101507436-B1 English Translation of Specification (Year: 2015).*
KR-101565091-B1 English Translation of Specification (Year: 2015).*
Yoo, et al., Monitoring and Purge Parameters of Ammonia for the Front Opening Unified Pod (FOUP), Advanced Science Letters, vol. 17, No. 1, Oct. 2012, pp. 280-284. (Translation, 20 pages).

* cited by examiner

SUBSTRATE CARRIER

RELATED APPLICATIONS

This application claims priority under 35 USC § 119 to Korean Patent Application No. 10-2017-0142873, filed on Oct. 30, 2017, the contents of which are incorporated by reference herein in their entirety.

BACKGROUND

Example embodiments relate to a substrate carrier. More particularly, example embodiments relate to a substrate carrier configured to transport a substrate such as a semiconductor substrate, a mask substrate, etc.

A substrate such as a semiconductor substrate, a mask substrate, etc. may be received in a substrate carrier. The substrate carrier may be transferred to semiconductor fabrication equipment. When an interior of the substrate carrier may be contaminated, the substrate in the substrate carrier may also be contaminated. Thus, controlling the internal contamination of the substrate carrier may be an important factor affecting a yield of semiconductor fabrication.

According to related arts, after transporting the substrate carrier to contamination analysis equipment, all air in the substrate carrier may be collected. The collected air may be analyzed to identify the internal contamination of the substrate carrier.

However, the internal contamination of the substrate carrier may be identified at a specific time at which the substrate carrier may be transported to the contamination analysis equipment. Therefore, it may difficult to accurately identify the internal contamination of the substrate carrier caused by any one among the more than one pieces of semiconductor fabrication equipment. Further, the internal contamination of the substrate carrier may not be identified during semiconductor fabrication processes. Particularly, the internal contamination of the substrate carrier may be removed after identifying the internal contamination by the contamination analysis equipment so that the substrate in the substrate carrier may be already contaminated.

SUMMARY

Example embodiments provide a substrate carrier that may be capable of detecting internal environments or environmental properties of the substrate carrier and removing internal contaminants of the substrate carrier in real time during a semiconductor fabrication process.

According to example embodiments, there may be provided a substrate carrier. The substrate carrier may include a carrier body and a first sensor unit. The carrier body may include an internal space, an inlet port and an outlet port. The internal space may be configured to receive a substrate. A purge gas may be introduced into the internal space through the inlet port. A gas in the internal space may be exhausted through the outlet port. The first sensor unit may be at or arranged at the outlet port to detect environments or environmental properties of the internal space in real time.

According to example embodiments, there may be provided a substrate carrier. The substrate carrier may include a carrier body, a first sensor unit or system, an outlet filter, a control unit or system and a battery. The carrier body may include an internal space, an inlet port and an outlet port. The internal space may be configured to receive a substrate. The inlet port may be at or arranged at a bottom surface of the internal space. A purge gas may be introduced into the internal space through the inlet port. The outlet port may be at or arranged at the bottom surface of the internal space. A gas in the internal space may be exhausted through the outlet port. The first sensor system may be at or arranged at the outlet port and configured to detect environments or environmental properties of the internal space in real time. The outlet filter may be in or arranged at the outlet port and configured to allow the gas exhausted from the internal space to reach the first sensor system and block a liquid in the internal space from reaching the first sensor system. The control system may be under or arranged under the bottom surface of the carrier body and configured to control operations of the first sensor system. The control system may be configured to control introduction of the purge gas through the inlet port in accordance with information of the environments or environmental properties of the internal space. The battery may be under or arranged under the bottom surface of the carrier body and configured to supply power to the control system.

According to example embodiments, the first sensor unit or system in or arranged at the outlet port may detect the internal environments or environmental properties of the carrier body in real time. Thus, a generation or cause of a contaminant in the carrier body may be accurately identified. Further, the purge gas may be introduced into the internal space of the carrier body in accordance with the internal environments or environmental properties of the carrier body detected by the first sensor unit or system so that the contaminant in the carrier body may be removed in real time. Particularly, the first sensor unit or system, the outlet filter, the control unit or system and the battery may be at or arranged at the bottom surface of the carrier body so that the substrate carrier previously used may be still used without a structure change of the substrate carrier.

According to example embodiments, there may be provided a substrate carrier. The substrate carrier may include a carrier body defining an internal space, an inlet port at a lower wall of the carrier body, an outlet port at the lower wall of the carrier body, a sensor system in the outlet port, an outlet filter in the outlet port, and a control system at the lower wall of the carrier body. The inlet port may be configured to inject purge gas therethrough into the internal space. The outlet port may be configured to exhaust the purge gas from the internal space. The sensor system may be configured to detect at least one environmental property in or of the internal space. The inlet filter may be between the internal space and the sensor system and may be permeable to the purge gas and impermeable to liquid. The control system may be configured to receive a signal indicating the at least one environmental property is outside a predetermined range and, in response, control injection of the purge gas through the inlet port.

BRIEF DESCRIPTION OF THE DRAWINGS

Example embodiments will be more clearly understood from the following detailed description taken in conjunction with the accompanying drawings.

FIG. 1 is an exploded perspective view illustrating a substrate carrier in accordance with example embodiments;

FIG. 2 is a front view illustrating the substrate carrier in FIG. 1;

FIG. 3 is a plan view illustrating the substrate carrier in FIG. 1;

FIG. 4 is a cross-sectional view taken along a line IV-IV' in FIG. 1;

FIG. 5 is a cross-sectional view taken along a line V-V' in FIG. 1;

FIG. 6 is a block diagram illustrating a sensor unit of the substrate carrier in FIG. 1;

FIG. 7 is a block diagram illustrating a control unit of the substrate carrier in FIG. 1;

FIG. 8 is a block diagram illustrating a connection arrangement or structure between the sensor unit, the control unit and a battery of the substrate carrier in FIG. 1;

FIG. 9 is an exploded perspective view illustrating a substrate carrier in accordance with example embodiments;

FIG. 10 is a front view illustrating the substrate carrier in FIG. 9;

FIG. 11 is an exploded perspective view illustrating a substrate carrier in accordance with example embodiments;

FIG. 12 is a front view illustrating the substrate carrier in FIG. 11;

FIG. 13 is an exploded perspective view illustrating a substrate carrier in accordance with example embodiments;

FIG. 14 is a graph showing changes of temperatures and humidity between two pieces of fabrication equipment measured using the substrate carrier in FIG. 1; and FIG. 15 is a graph showing concentrations and humidity of ammonia in a photo process measured using the substrate carrier in FIG. 1.

DETAILED DESCRIPTION OF THE EMBODIMENTS

Hereinafter, example embodiments will be explained in detail with reference to the accompanying drawings. As used herein the expression "and/or" includes any and all combinations of one or more of the associated listed items.

Figure 1:
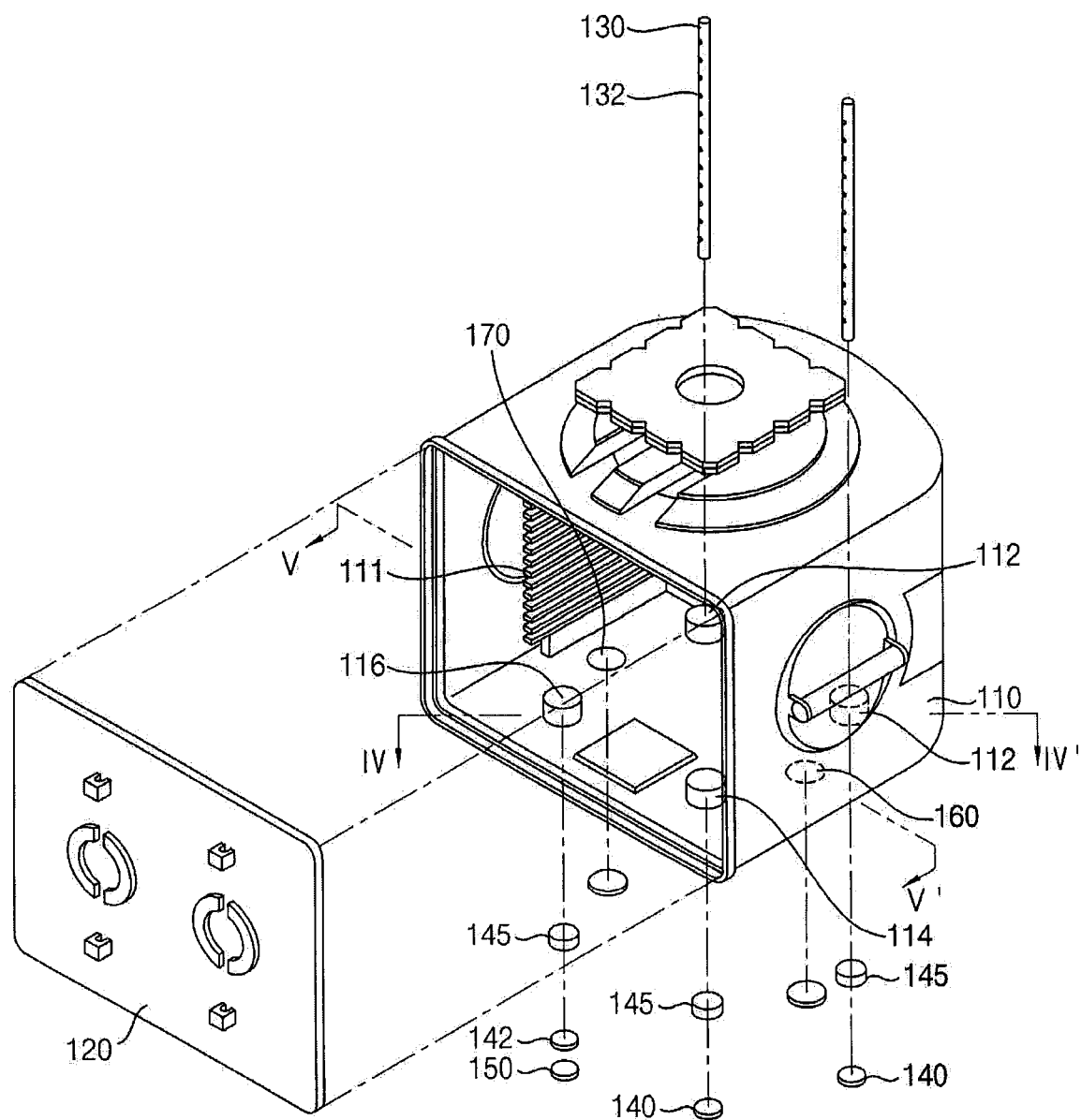
FIGS. 1 to 15 represent non-limiting, example embodiments as described herein.
Figure 2:
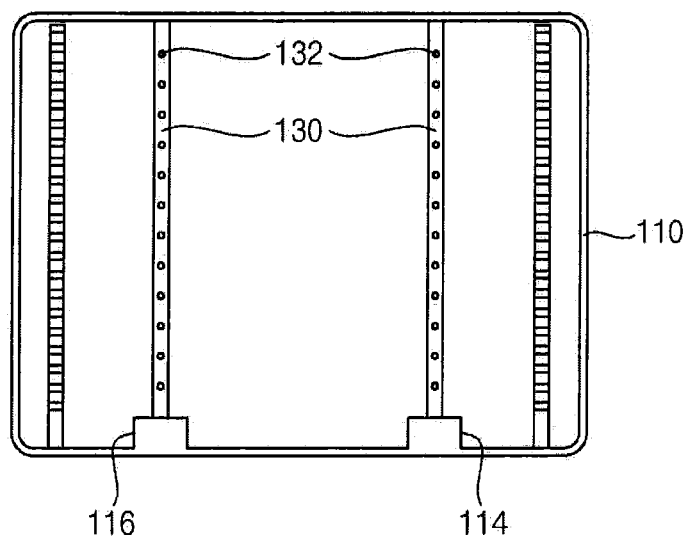
Figure 3:
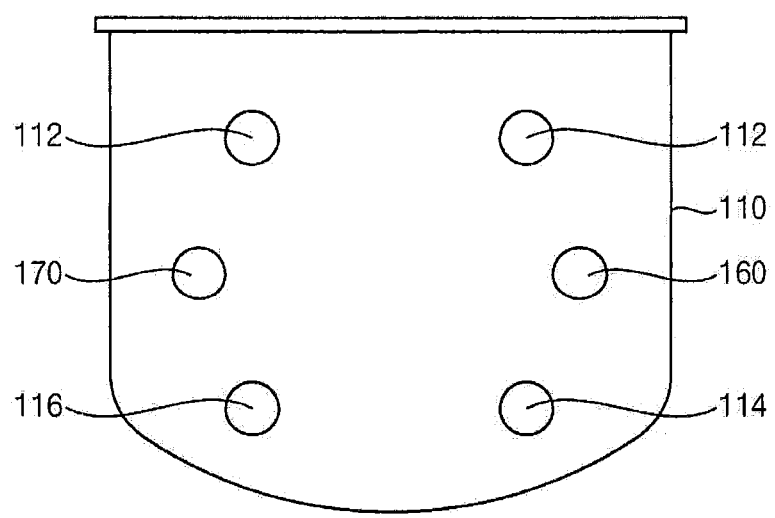
Figure 4:
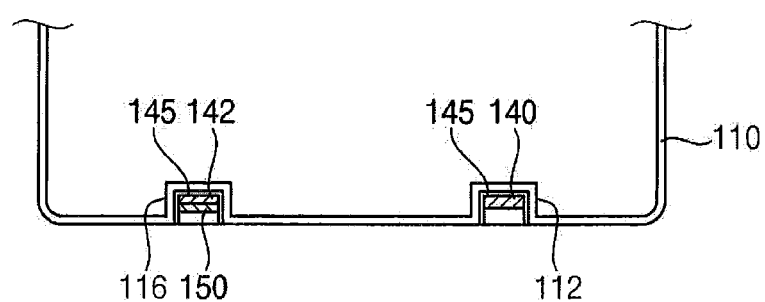
Figure 5:
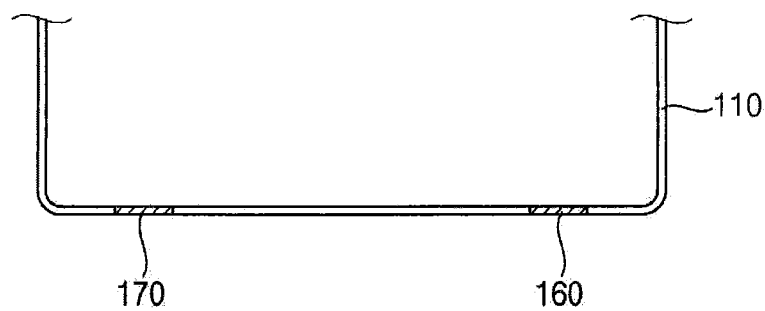

FIG. 1 is an exploded perspective view illustrating a substrate carrier in accordance with example embodiments, FIG. 2 is a front view illustrating the substrate carrier in FIG. 1, FIG. 3 is a plan view illustrating the substrate carrier in FIG. 1, FIG. 4 is a cross-sectional view taken along a line IV-IV' in FIG. 1, and FIG. 5 is a cross-sectional view taken along a line V-V' in FIG. 1.

Referring to FIGS. 1 to 5, a substrate carrier of this example embodiment may be configured to receive a plurality of semiconductor substrates. The substrate carrier may transport the semiconductor substrates to semiconductor fabrication equipment. Further, the substrate carrier may transport the semiconductor substrates from the semiconductor fabrication equipment to a stocker. In example embodiments, the substrate carrier may include a front open unified pod (FOUP). Alternatively, the substrate carrier may include a front opening shipping box (FOSB).

The substrate carrier may include a carrier body 110, a door 120, at least one snorkel 130, an inlet filter 140, an outlet filter 142, a first sensor unit or system 150, a control unit or system 160 and a battery 170.

The carrier body 110 may have or define an internal space configured to receive the substrates. The carrier body 110 may have a rectangular parallelepiped or cuboid shape having an open front or front surface. Thus, the carrier body 110 may have an upper or top surface or wall, a lower or bottom surface or wall, a rear or back surface or wall and two side surfaces or walls. The internal space of the carrier body 110 may be defined by the upper surface, the bottom surface, the rear surface and the side surfaces. Slots 111 may be formed or disposed at or adjacent the side surfaces of the carrier body 110. The substrates may be inserted into the slots 111. The door 120 may be installed at the open front surface of the carrier body 110.

The carrier body 110 may include two first inlet ports 112, a second inlet port 114 and an outlet port 116. The first inlet ports 112, the second inlet port 114 and the outlet port 116 may be arranged at or adjacent corners of the bottom surface of the carrier body 110. The first inlet ports 112, the second inlet port 114 and the outlet port 116 may protrude from the bottom surface of the carrier body 110 (e.g., protrude upwardly from the bottom surface of the carrier body 110).

A purge gas may be introduced or injected into the internal space of the carrier body 110 through the first inlet ports 112. The purge gas may be contained in and provided by a purge gas source. Air in the carrier body 110 may be exhausted through the outlet port 116 by the purge gas. Thus, the purge gas may function as to remove contaminants in the carrier body 110. The purge gas may be controlled by a main controller configured to wholly control operations of the substrate carrier. Particularly, in example embodiments, the contaminants may be removed by the purge gas in real time during semiconductor fabrication processes.

After any one among the plurality of semiconductor fabrication processes may be performed, the air in the carrier body 110 may be analyzed. In order to analyze the air, a purge gas may be introduced or injected into the carrier body 110 through the second inlet port 114. The purge gas may be contained in and provided by a purge gas source. The air exhausted through the outlet port 116 may then be collected.

The two snorkels 130 may be arranged in the carrier body 110. The snorkels 130 may be vertically arranged on or adjacent the rear surface of the carrier body 110. Each of the snorkels 130 may have a plurality of injecting or injection holes 132. The snorkels 130 may be connected to the first inlet ports 112. Thus, the purge gas introduced through the first inlet ports 112 may be uniformly injected to the internal space of the carrier body 110 through the injecting holes 132 of the snorkels 130.

Filter housings 145 may be arranged in the first inlet ports 112, the second inlet port 114 and the outlet port 116. The inlet filter 140 may be installed at or in the filter housings 145 in the first inlet ports 112 and the second inlet port 114. The outlet filter 142 may be installed at or in the filter housing 145 in the outlet port 116.

The inlet filter 140 and the outlet filter 142 may be configured to allow a pass of the gas and block a pass of a liquid. That is, the inlet filter 140 may allow the introducing of the gas such as the purge gas into the carrier body 110 through the first inlet ports 112 and the second inlet port 114. In contrast, the inlet filter 140 may prevent the liquid from infiltrating into the carrier body 110 through the first inlet ports 112 and the second inlet port 114. The outlet filter 142 may allow the exhausing of the gas in the carrier body 110 through the outlet port 116. In contrast, the outlet filter 142 may prevent the liquid in the carrier body 110 from being exhausted through the outlet port 116.

The inlet filter 140 and the outlet filter 142 having the above-mentioned functions may include porous polymer. For example, the inlet filter 140 and the outlet filter 142 may include polycarbonate, polytetrafluoroethylene (PTFE), polyfluoroalkoxy (PFA), polyvinylidene fluoride (PVDF), PTTE, polyethylene (PE), etc.

The first sensor unit 150 may be arranged in the outlet port 116. Particularly, the first sensor unit 150 may be installed at or in the filter housing 145 in the outlet port 116. Thus, it may not be required to change a structure of the substrate carrier in order to arrange the first sensor unit 150 (e.g., the substrate carrier may not need to be deconstructed in order to install the first sensor unit 150). The first sensor unit 150 may be positioned under the outlet filter 142. Because the outlet filter 142 may allow the passing of the gas and not allow the passing of the liquid, the liquid in the carrier body 110 may not be introduced into the first sensor unit 150 through the outlet filter 142. In contrast, the gas in the carrier body 110 may be introduced into the first sensor unit 150 through the outlet filter 142.

The first sensor unit 150 may detect internal environments or environmental characteristics or properties of the carrier body 110 using the gas introduced through the outlet port 116 and the outlet filter 142. Particularly, the first sensor unit 150 may detect the internal environments of the carrier body 110 in real time during the semiconductor fabrication processes.

Figure 6:
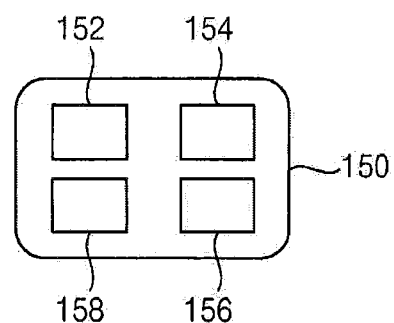

FIG. 6 is a block diagram illustrating a sensor unit of the substrate carrier in FIG. 1.

Referring to FIG. 6, the first sensor unit 150 may include a temperature sensor 152, a contaminant sensor 154, a humidity sensor 156 and a vibration sensor 158.

The temperature sensor 152 may detect an internal temperature of the carrier body 110 in real time. The contaminant sensor 154 may detect contaminants in the carrier body 110 in real time. The contaminants detected by the contaminant sensor 154 may include $NH_3$, HCl, HF, etc. However, the contaminants detected by the contaminant sensor 154 may include other contaminants as well as the above-mentioned contaminants. The humidity sensor 156 may detect a humidity of or in the carrier body 110 in real time. The vibration sensor 158 may detect vibrations of the carrier body 110 in real time.

Referring to FIGS. 1 to 5, the control unit 160 may be arranged at, in or under the bottom surface of the carrier body 110. Because a space under the bottom surface of the carrier body 110 may be empty, the control unit 160 may be installed at the carrier body 110 without a structure change of the substrate carrier (e.g., without deconstruction of the substrate carrier).

The control unit 160 may be configured to control the operations of the first sensor unit 150. Further, the control unit 160 may be configured to control the introduction of the purge gas through the first inlet ports 112. The control unit 160 may also be referred to herein as a main controller or processor.

Figure 7:
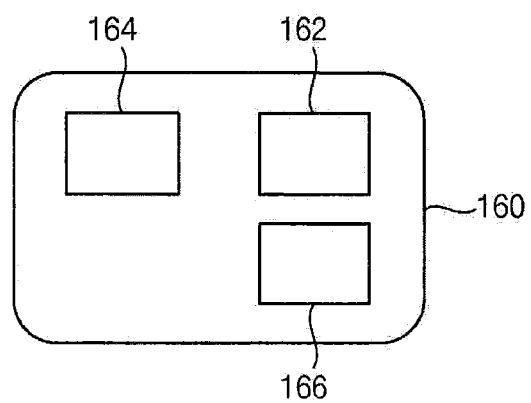

FIG. 7 is a block diagram illustrating a control unit of the substrate carrier in FIG. 1.

Referring to FIG. 7, the control unit 160 may include a drive chip or module 162, a storage chip or module 164 and a communication chip or module 166.

The drive chip 162 (also referred to herein as a controller, processor, secondary controller, or secondary processor) may be configured to control the operations of the first sensor unit 150. The storage chip 164 (also referred to herein as a memory) may be configured to store information of the internal environments of the carrier body 110 detected by the first sensor unit 150. That is, the internal temperature detected by the temperature sensor 152, the contaminants detected by the contaminant sensor 154, the internal humidity of the carrier body 110 detected by the humidity sensor 156, and the vibration of the carrier body 110 detected by the vibration sensor 158 may be stored in the storage chip 164.

The communication chip 166 (also referred to herein as a transmitter or transceiver) may be coupled to the main controller for wholly controlling the operations of the substrate carrier. The communication chip 166 may transmit the information with respect to the internal environments of the carrier body 110 stored in the storage chip 164 to the main controller. The main controller may function as to selectively introduce the purge gas into the carrier body 110 through the first inlet ports 112 in accordance with the information with respect to the internal environments of the carrier body 110.

For example, when the internal temperature of the carrier body 110 detected by the temperature sensor 152 may be outside a set temperature range, the purge gas may be introduced into the carrier body 110 through the first inlet ports 112 and/or the snorkels 130 by or under the direction of the main controller. Thus, the air in the carrier body 110 may be exhausted through the outlet port 116 to provide the carrier body 110 with a set internal temperature. The temperature correction operation may be performed in real time during the semiconductor fabrication processes.

When the contaminant sensor 154 may detect the contaminant in the carrier body 110, the purge gas may be introduced into the carrier body 110 through the first inlet ports 112 and/or the snorkels 130 by or under the direction of the main controller. Thus, the contaminant in the carrier body 110 may be exhausted through the outlet port 116. The contaminant removal operation may be performed in real time during the semiconductor fabrication processes.

When the internal humidity of the carrier body 110 detected by the humidity sensor 156 may be outside a set humidity range, the purge gas may be introduced into the carrier body 110 through the first inlet ports 112 and/or the snorkels 130 by or under the direction of the main controller. Thus, the air in the carrier body 110 may be exhausted through the outlet port 116 with moisture to provide the carrier body 110 with a set internal humidity. The humidity correction operation may be performed in real time during the semiconductor fabrication processes.

When the vibration sensor 158 may detect the vibration of the carrier body 110, the main controller may stop the substrate carrier being moved along a rail. After checking the rail, the main controller may move the substrate carrier.

Referring to FIGS. 1 to 5, the battery 170 may be arranged at, in or under the bottom surface of the carrier body 110. Because the space under the bottom surface of the carrier body 110 may be empty, the battery 170 may be installed at the carrier body 110 without the structure change of the substrate carrier (e.g., without deconstruction of the substrate carrier).

Figure 8:
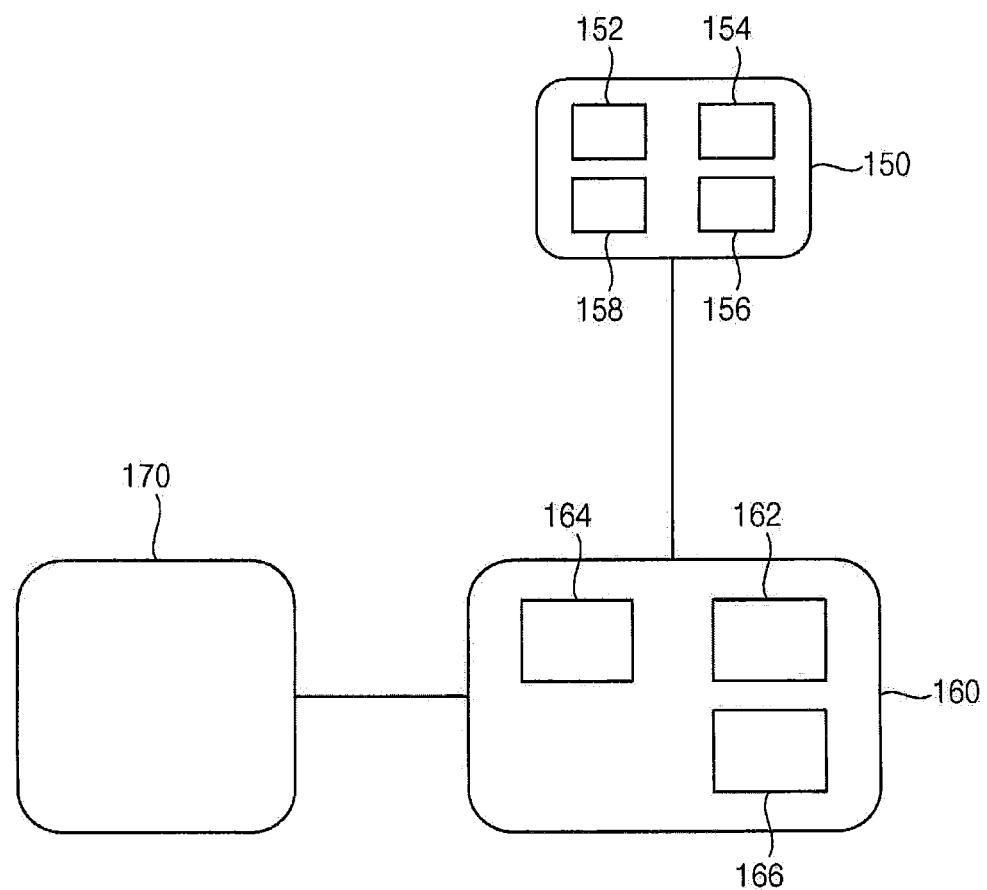

FIG. 8 is a block diagram illustrating a connection arrangement or structure between the sensor unit, the control unit and a battery of the substrate carrier in FIG. 1.

Referring to FIG. 8, the battery 170 may be configured to supply power to the control unit 160. The control unit 160 may be electrically connected with the first sensor unit 150.

Figure 9:
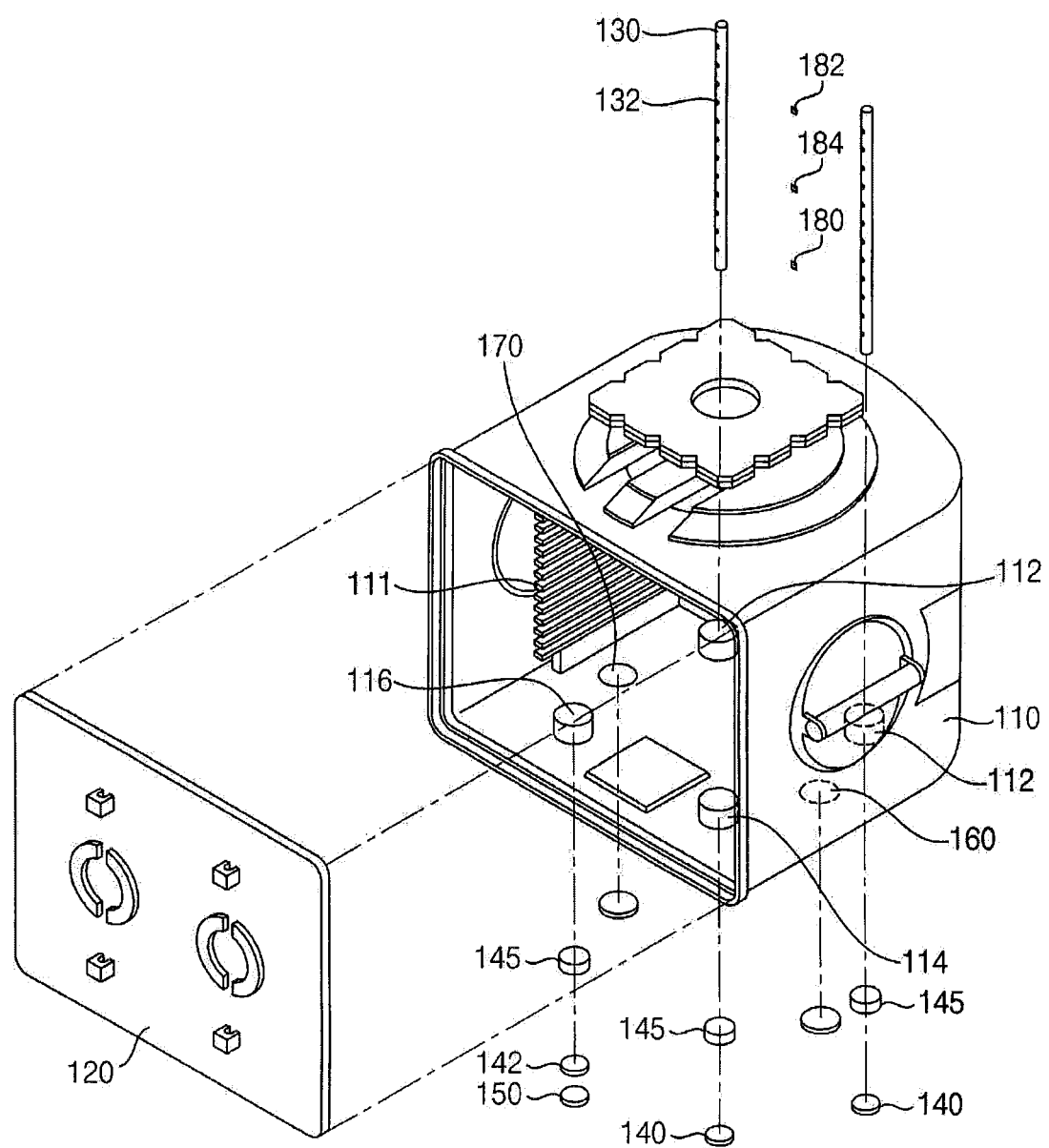
Figure 10:
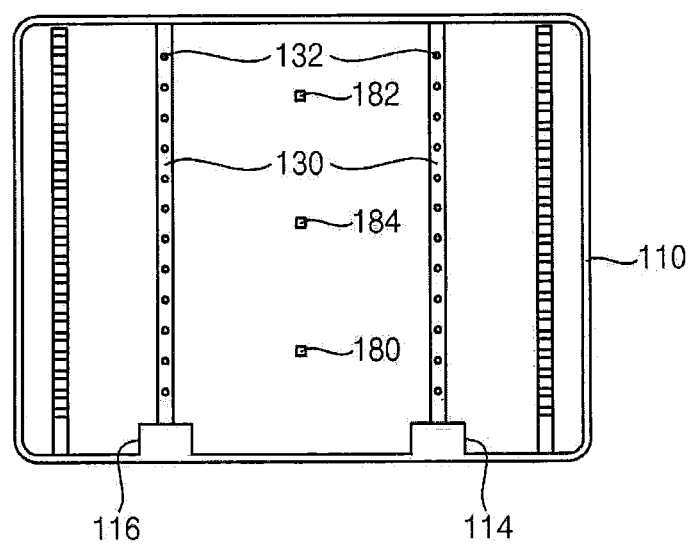

FIG. 9 is an exploded perspective view illustrating a substrate carrier in accordance with example embodiments, and FIG. 10 is a front view illustrating the substrate carrier in FIG. 9.

A substrate carrier of this example embodiment may include elements substantially the same as those of the substrate carrier in FIG. 1 except for further including second to fourth sensor units or systems. Thus, the same reference numerals may refer to the same elements and any further description or illustrations with respect to the same elements may be omitted herein for brevity.

Referring to FIGS. 9 and 10, the second sensor unit 180 may be arranged at a lower portion of the rear surface of the carrier body 110. The third sensor unit 182 may be arranged at an upper portion of the rear surface of the carrier body 110. The fourth sensor unit 184 may be arranged at a central or middle portion of the rear surface of the carrier body 110. That is, the fourth sensor unit 184 may be arranged between the second sensor unit 180 and the third sensor unit 182.

The second sensor unit 180 may be configured to detect internal environments or environmental characteristics or properties of a lower region in the internal space of the carrier body 110. The third sensor unit 182 may be configured to detect internal environments or environmental characteristics or properties of an upper region in the internal space of the carrier body 110. The fourth sensor unit 184 may be configured to detect internal environments or environmental characteristics or properties of a central or middle region in the internal space of the carrier body 110. The information with respect to the internal environments detected by the second to fourth sensor units 180, 182 and 184 may be transmitted to the control unit 160.

The second to fourth sensor units 180, 182 and 184 may have structures and functions substantially the same as those of the first sensor unit 150. Thus, any further description or illustrations with respect to the structures and functions of the second to fourth sensor units 180, 182 and 184 may be omitted herein for brevity.

Figure 11:
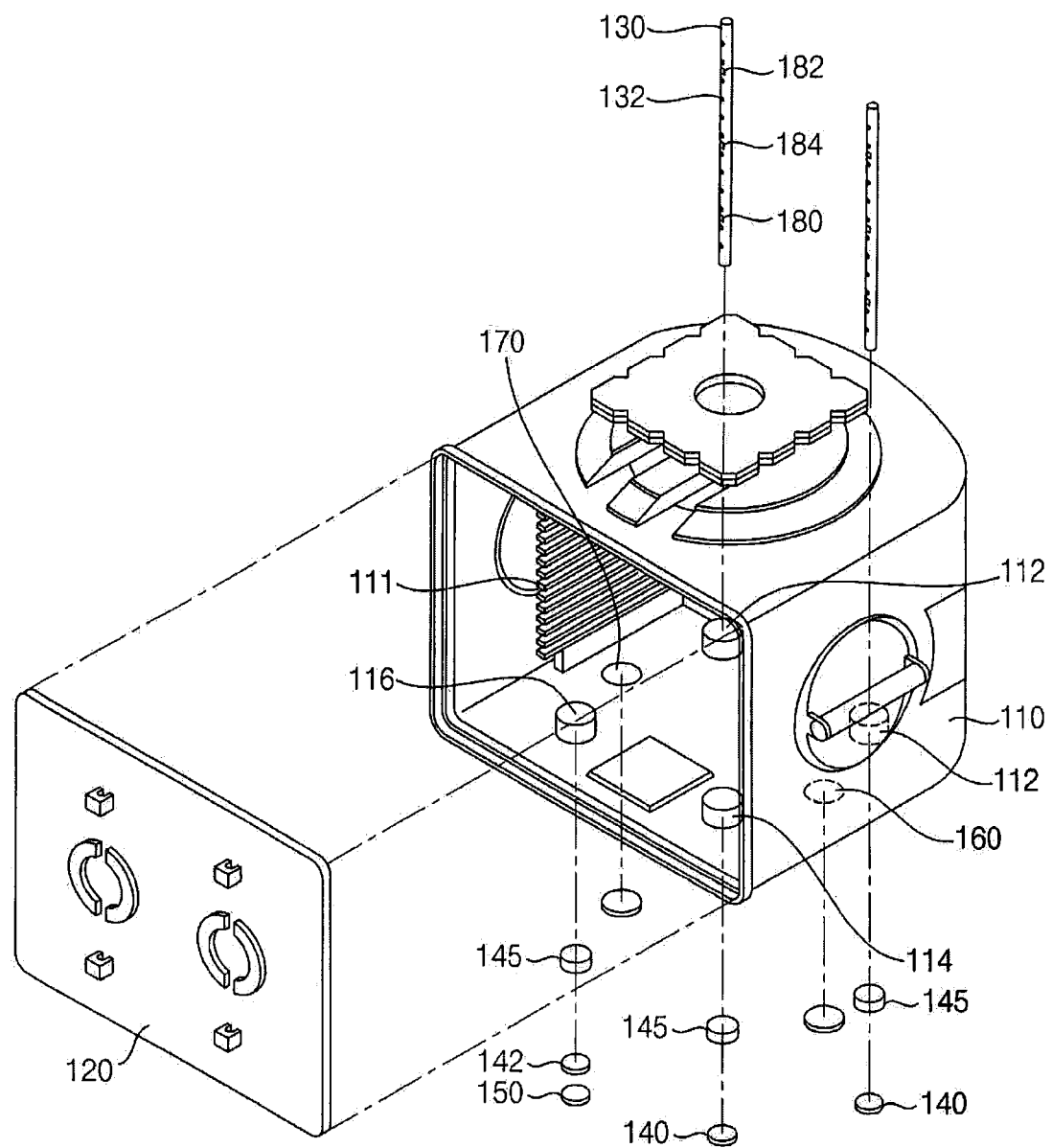
Figure 12:
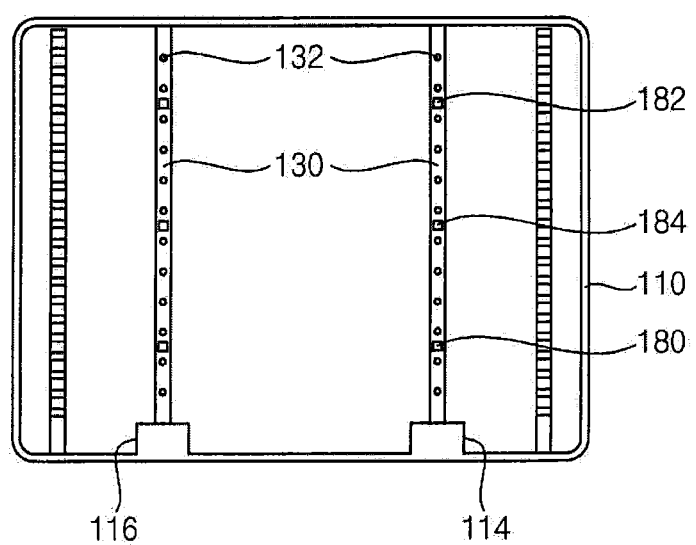

FIG. 11 is an exploded perspective view illustrating a substrate carrier in accordance with example embodiments, and FIG. 12 is a front view illustrating the substrate carrier in FIG. 11.

A substrate carrier of this example embodiment may include elements substantially the same as those of the substrate carrier in FIG. 9 except for positions of the second to fourth sensor units. Thus, the same reference numerals may refer to the same elements and any further description or illustrations with respect to the same elements may be omitted herein for brevity.

Referring to FIGS. 11 and 12, the second sensor unit 180, the third sensor unit 182 and the fourth sensor unit 184 may be attached or connected to the snorkel 130. The second sensor unit 180 may be attached to a lower portion of the snorkel 130. The third sensor unit 182 may be attached to an upper portion of the snorkel 130. The fourth sensor unit 184 may be attached to a middle portion of the snorkel 130.

In example embodiments, the substrate carrier may include the second to fourth sensor units 180, 182 and 184. However, the substrate carrier may include any one of the second to fourth sensor units 180, 182 and 184. Further, the substrate carrier may include the second and third sensor units 180 and 182.

Figure 13:
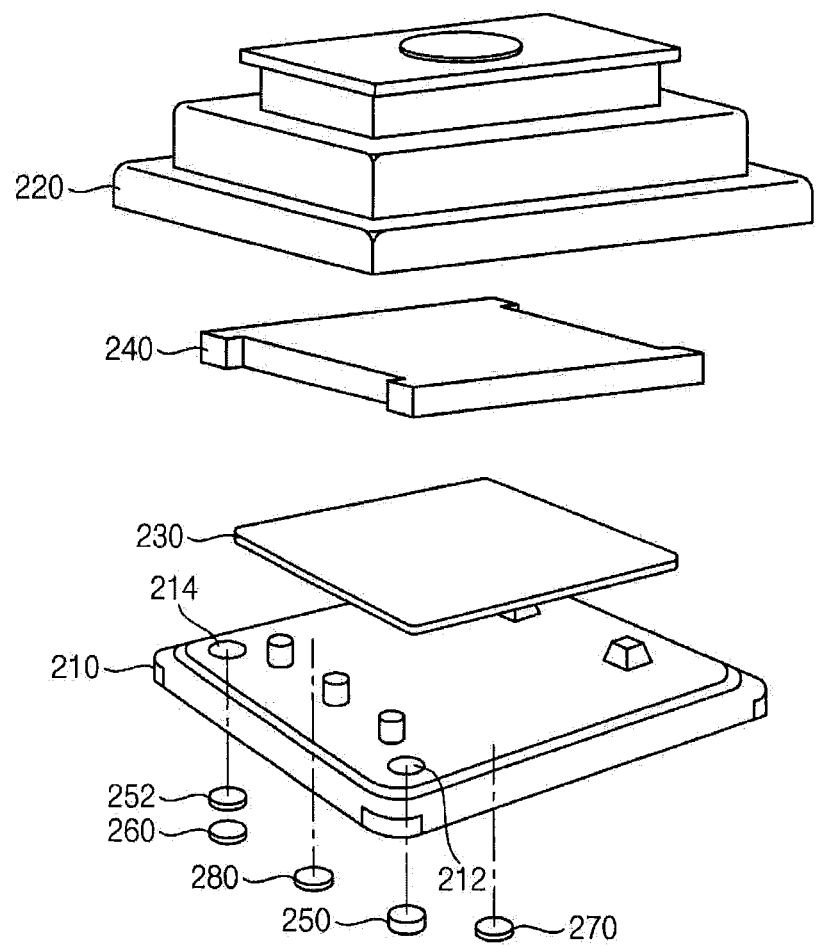

FIG. 13 is an exploded perspective view illustrating a substrate carrier in accordance with example embodiments.

Referring to FIG. 13, a substrate carrier of this example embodiment may be configured to receive a reticle. The substrate carrier may include an outer base 210, an outer cover 220, an inner base 230, an inner cover 240, an inlet filter 250, an outlet filter 252, a sensor unit or system 260, a control unit or system 270 and a battery 280.

The outer cover 220 may be arranged over the outer base 210. The outer cover 220 may cover the outer base 210 to form or define an inner space configured to receive the reticle. Thus, the outer base 210 and the outer cover 220 may correspond to the carrier body 110 of the substrate carrier in FIG. 1.

The inner base 230 may be arranged on an upper or top surface of the outer base 210. The inner cover 240 may be arranged on a bottom or lower surface of the outer cover 220. The reticle may be received in a space between the inner base 230 and the inner cover 240.

The outer base 210 may include an inlet port 212 and an outlet port 214. The inlet port 212 may correspond to the first inlet port 112 of the carrier body 110 in FIG. 1. Thus, the purge gas may be introduced into the substrate carrier through the inlet port 212. The outlet port 214 may correspond to the outlet port 116 of the carrier body 110 in FIG. 1. Thus, the air in the substrate carrier may be exhausted through the outlet port 214.

The inlet filter 250 may be installed in the inlet port 212. The outlet filter 252 may be installed in the outlet port 214. The inlet filter 250 and the outlet filter 252 may have structures and functions substantially the same as those of the inlet filter 140 and the outlet filter 142 in FIG. 1, respectively. Thus, any further description or illustrations with respect to the inlet filter 250 and the outlet filter 252 may be omitted herein for brevity.

The sensor unit 260 may be arranged under the outlet filter 252. The sensor unit 260 may have structures and functions substantially the same as those of the first sensor unit 150 in FIG. 1. Thus, any further description or illustrations with respect to the sensor unit 260 may be omitted herein for brevity.

The control unit 270 may be arranged at, in or under the bottom surface of the outer base 210. The control unit 270 may have structures and functions substantially the same as those of the control unit 160 in FIG. 1. Thus, any further description or illustrations with respect to the control unit 270 may be omitted herein for brevity.

The battery 280 may be arranged under a bottom or lower surface of the outer base 210. The battery 280 may have structures and functions substantially the same as those of the battery 170 in FIG. 1. Thus, any further description or illustrations with respect to the battery 280 may be omitted herein for brevity.

Therefore, the sensor unit 260, the control unit 270 and the battery 280 may be installed at the outer base 210 without structure changes of the substrate carrier (e.g., without deconstruction of the substrate carrier).

Figure 14:
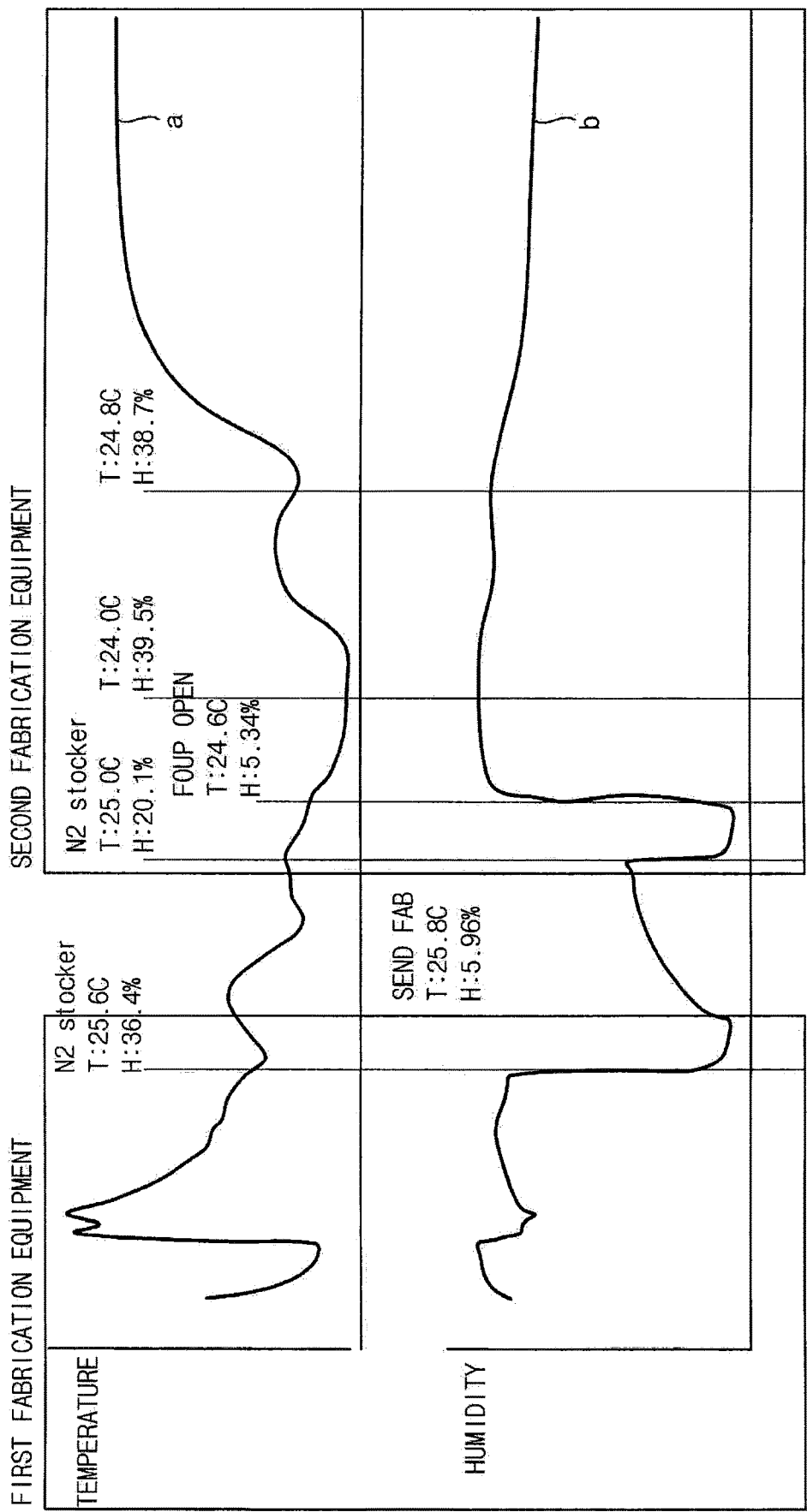

FIG. 14 is a graph showing changes of temperatures and humidity between two pieces of fabrication equipment measured using the substrate carrier in FIG. 1. In FIG. 14, a line "a" may represent a temperature and a line "b" may represent humidity.

Referring to FIG. 14, as the substrate carrier may be moved from a first fabrication equipment to a second fabrication equipment, the temperature sensor 152 of the sensor unit 150 may continuously measure the internal temperature of the substrate carrier in real time. Further, the humidity sensor 156 of the sensor unit 150 may continuously measure the humidity of the substrate carrier in real time.

Figure 15:
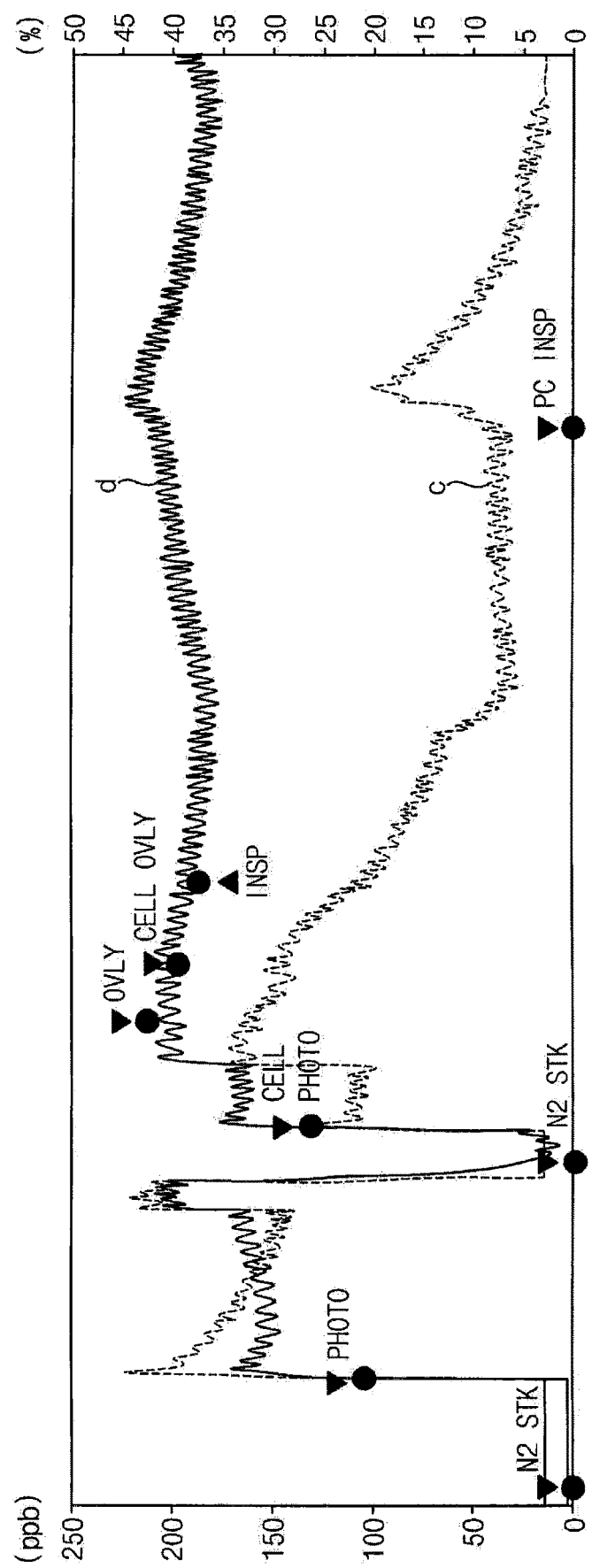

FIG. 15 is a graph showing concentrations and humidity of ammonia in a photo process measured using the substrate carrier in FIG. 1. In FIG. 15, a line "c" may represent a concentration of ammonia and a line "d" may represent humidity.

Referring to FIG. 15, as the substrate carrier may be positioned in equipment for processing a photo process, the contaminant sensor 154 of the sensor unit 150 may continuously measure the concentration of the ammonia in the air of the substrate carrier (e.g., in real time). Further, the humidity sensor 156 of the sensor unit 150 may continuously measure the humidity of the substrate carrier in real time.

According to example embodiments, the first sensor unit arranged at the outlet port may detect the internal environments or environmental characteristics or properties of the carrier body in real time. Thus, a generation or cause of a contaminant in the carrier body may be accurately identified. Further, the purge gas may be introduced into the internal space of the carrier body in accordance with the internal environments of the carrier body detected by the first sensor unit so that the contaminant in the carrier body may be removed in real time. Particularly, the first sensor unit, the outlet filter, the control unit and the battery may be arranged at the bottom surface of the carrier body so that the substrate carrier previously used may be still used without a structure change of the substrate carrier.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A substrate carrier comprising:
   a carrier body including an internal space, an inlet port and an outlet port, the internal space configured to receive a substrate, the inlet port configured to introduce a purge gas into the internal space therethrough, and the outlet port configured to exhaust a gas from the internal space;
   a first sensor unit in the outlet port and configured to detect environmental properties of the internal space in real time;
   an outlet filter in the outlet port; and
   an outlet filter housing in the outlet port,
   wherein the first sensor unit and the outlet filter are in the outlet filter housing, and
   the outlet filter is between the internal space and the first sensor unit.

2. The substrate carrier of claim 1, wherein the outlet filter is configured to allow the gas in the internal space to pass to the first sensor unit and block a liquid in the internal space from reaching the first sensor unit.

3. The substrate carrier of claim 1, further comprising an inlet filter in the inlet port and configured to allow the purge gas to be introduced into the internal space and block a liquid from reaching the internal space.

4. The substrate carrier of claim 1, wherein the outlet port is at a bottom surface of the carrier body and protrudes upwardly from the bottom surface of the carrier body.

5. The substrate carrier of claim 1, wherein the inlet port is at a bottom surface of the carrier body and protrudes upwardly from the bottom surface of the carrier body.

6. The substrate carrier of claim 1, wherein the first sensor unit comprises:
   a temperature sensor configured to detect a temperature of the internal space;
   a contaminant sensor configured to detect a contaminant in the internal space; and
   a humidity sensor configured to detect a humidity of the internal space.

7. The substrate carrier of claim 6, wherein the first sensor unit further comprises a vibration sensor configured to detect a vibration of the carrier body.

8. The substrate carrier of claim 1, further comprising a control unit configured to control operations of the first sensor unit and introduction of the purge gas through the inlet port in accordance with information relating to the environmental properties of the internal space detected by the first sensor unit.

9. The substrate carrier of claim 8, wherein the control unit comprises:
   a controller configured to control the operations of the first sensor unit;
   a memory configured to store the information relating to the environmental properties of the internal space; and
   a transmitter or transceiver configured to transmit the information relating to the environmental properties of the internal space to a main controller that is configured to control the introduction of the purge gas,
   wherein the main controller is under a bottom surface of the carrier body.

10. The substrate carrier of claim 8, wherein the control unit is connected to the carrier body and under a bottom surface of the carrier body.

11. The substrate carrier of claim 8, further comprising a battery configured to supply power to the control unit, wherein the battery is optionally under a bottom surface of the carrier body.

12. The substrate carrier of claim 1, further comprising:
   a second sensor unit at a lower region of the internal space and configured to detect environmental properties of the lower region in real time; and
   a third sensor unit at an upper region of the internal space and configured to detect environmental properties of the upper region in real time.

13. The substrate carrier of claim 12, further comprising a fourth sensor unit at a central region of the internal space and configured to detect environmental properties of the central region in real time.

14. The substrate carrier of claim 13, wherein the second sensor unit, the third sensor unit and the fourth sensor unit are connected to an inner surface of the carrier body.

15. The substrate carrier of claim 13, wherein the second sensor unit, the third sensor unit and the fourth sensor unit are connected to a snorkel vertically arranged in the carrier body and connected to the inlet port.

16. A substrate carrier comprising:
   a carrier body including an internal space, an inlet port and an outlet port, the internal space configured to receive a substrate, the inlet port at a bottom surface of the carrier body and configured to introduce a purge gas into the internal space therethrough, and the outlet port at the bottom surface of the carrier body and configured to exhaust a gas from the internal space;
   a first sensor system in the outlet port and configured to detect environmental properties of the internal space in real time;
   an outlet filter in the outlet port and configured to allow the gas exhausted from the internal space to reach the first sensor system and block a liquid in the internal space from reaching the first sensor system;
   a control system under the bottom surface of the carrier body and configured to control operations of the first sensor system and introduction of the purge gas through the inlet port in accordance with information relating to the environmental properties of the internal space; and
   a battery under the bottom surface of the carrier body and configured to supply power to the control system,
   wherein the outlet port protrudes upwardly from the bottom surface of the carrier body,
   an outlet filter housing is in the outlet port, the first sensor system and the outlet filter are in the outlet filter housing, and the outlet filter is between the internal space and the first sensor system.

17. The substrate carrier of claim 16, wherein the first sensor system comprises:
a temperature sensor configured to detect a temperature of the internal space;
a contaminant sensor configured to detect a contaminant in the internal space;
a humidity sensor configured to detect a humidity of the internal space; and
a vibration sensor configured to detect a vibration of the carrier body.

18. The substrate carrier of claim 16, wherein the control system comprises:
a controller configured to control the operations of the first sensor system;
a memory configured to store the information relating to the environmental properties of the internal space; and
a transmitter or transceiver configured to transmit the information relating to the environmental properties of the internal space to a main controller that is configured to control the introduction of the purge gas.

19. The substrate carrier of claim 16, further comprising:
a second sensor system at a lower region of the internal space and configured to detect environmental properties of the lower region in real time;
a third sensor system an upper region of the internal space and configured to detect environmental properties of the upper region in real time; and
a fourth sensor system at a central region of the internal space and configured to detect environmental properties of the central region in real time.

20. A substrate carrier comprising:
a carrier body defining an internal space;
an inlet port at a lower wall of the carrier body, the inlet port configured to inject purge gas therethrough into the internal space;
an outlet port at the lower wall of the carrier body, the outlet port configured to exhaust the purge gas from the internal space;
a sensor system in the outlet port that is configured to detect at least one environmental property in or of the internal space;
an outlet filter in the outlet port and between the internal space and the sensor system, the outlet filter permeable to the purge gas and impermeable to liquid;
an outlet filter housing in the outlet port; and
a control system at the lower wall of the carrier body, the control system configured to receive a signal indicating the at least one environmental property is outside of a predetermined range and, in response, control injection of the purge gas through the inlet port,
wherein the sensor system and the outlet filter are in the outlet filter housing.

* * * * *